United States Patent [19]

Morris, Jr. et al.

[11] Patent Number: 5,224,169
[45] Date of Patent: Jun. 29, 1993

[54] PROTECTION ARRANGEMENT FOR AN AUDIO OUTPUT CHANNEL

[75] Inventors: Robert E. Morris, Jr.; Mark R. Anderson, both of Indianapolis, Ind.

[73] Assignee: Thomson Consumer Electronics, Inc., Indianapolis, Ind.

[21] Appl. No.: 699,373

[22] Filed: May 13, 1991

[51] Int. Cl.$^5$ .......................................... H03G 11/00
[52] U.S. Cl. .................................. 381/55; 330/207 P; 381/120
[58] Field of Search ................. 330/207 P; 381/55, 28, 381/120

[56] References Cited

U.S. PATENT DOCUMENTS

| 3,659,218 | 4/1972 | Haneda | 330/207 |
|---|---|---|---|
| 3,691,427 | 9/1972 | Honda et al. | 317/31 |
| 3,731,153 | 5/1973 | Nishimoto | 317/33 |
| 3,996,497 | 12/1976 | Kamimura | 330/207 P |
| 4,010,402 | 3/1977 | Miyata | 361/56 |
| 4,034,268 | 7/1977 | Klauck | 330/207 P |
| 4,042,889 | 8/1977 | Baker | 330/207 P |
| 4,296,278 | 10/1981 | Cullison et al. | |
| 4,330,686 | 5/1982 | Roe | |
| 4,402,029 | 8/1983 | Fujita | 330/207 P |

FOREIGN PATENT DOCUMENTS

| 80/02477 | 11/1980 | European Pat. Off. |
| 0280327 | 8/1988 | European Pat. Off. |
| 3430269 | 2/1986 | Fed. Rep. of Germany |
| 4127482 | 3/1992 | Fed. Rep. of Germany |
| 1486512 | 9/1977 | United Kingdom |
| 2070374 | 9/1981 | United Kingdom |
| 2141301 | 12/1984 | United Kingdom |
| 2250151 | 5/1992 | United Kingdom |

*Primary Examiner*—Forester W. Isen
*Attorney, Agent, or Firm*—Joseph S. Tripoli; Peter M. Emanuel

[57] ABSTRACT

A protection circuit for an audio output channel of a television receiver includes a detector which detects the presence of either or both of (1) a sustained DC component applied to the loudspeaker form the audio power amplifier, (2) and the loss of a supply voltage for the power amplifier. The presence of a of a sustained DC component can damage the loudspeaker. The loss of a supply voltage of the power amplifier can damage the power amplifier and can also result in the application of a sustained DC amplifier and can also result in the application of a sustained DC component to the loudspeaker. For example, the loss of the negative supply voltage of a power amplifier incorporated in an integrated circuit results in the removal of potential from the substrate which otherwise serves to electrically isolates various semiconductor devices supported by the substrate. The detector includes a low pass filter coupled between the output of the power amplifier and inputs of first and second comparators to detect when the output of the low pass filter is within or outside of a "window". A transistor switch is coupled to output of the comparators. As long as the output of the low pass filter is within the window, each comparator generates a respective low level output signal which keeps the transistor switch turned off. However, if the output signal of the lowpass filter is outside of the window, one of the comparators generates a high level output signal signal which causes the transistor switch to be turned on. The comparators normally receive the same supply voltages as the power amplifier, and the loss of the negative supply voltages does not enable either of the comparators to generates a low enough level output signal for keeping the transistor off.

10 Claims, 2 Drawing Sheets

PROTECTION ARRANGEMENT FOR AN AUDIO OUTPUT CHANNEL

FIELD OF THE INVENTION

The invention concerns a protection arrangement for an audio output channel, and particularly a protection arrangement for detecting when a sustained DC component capable of damaging a loudspeaker is developed at the output of a audio power amplifier.

BACKGROUND OF THE INVENTION

Normally the average or DC component of an audio signal applied to a loudspeaker is negligible. However, a failure within the power amplifier driving the loudspeaker may cause a sustained DC component to be applied to the loudspeaker. A loudspeaker can be damaged when a sustained DC signal is applied to it. Accordingly, an audio output channel may include a so-called DC detector coupled to the output of the power amplifier for generating a fault indicating signal when a sustained DC signal is developed. A variety of actions can be taken for protecting the loudspeaker in response to the fault signal. For example the equipment containing the audio channel may be turned off. U.S. patent application Ser. No. 571,726, entitled "Shutdown System for a Television Receiver", filed for R. E. Morris, Jr. and G. H. Johnson on Aug. 27, 1990, and assigned to the same assignee as the present application, discloses a protection arrangement for a loudspeaker of a television receiver including a DC detector and provisions for turning the receiver off when a DC fault is detected.

SUMMARY OF THE INVENTION

An aspect of the invention concerns the recognition that it is desirable to detect the occurrence of certain other fault conditions in an audio output channel. More specifically, it has been recognized that the loss of one of the positive and negative power supply voltages for the audio power amplifier may cause a DC component to be coupled to the loudspeaker which may not be detected by a conventional DC detector and which may damage the power amplifier. Another aspect of the invention concerns a DC detector which itself is capable of detecting either (1) the presence of a sustained DC component at the output of an audio power amplifier, or (2) the loss of one of the power supply voltages for the power amplifier.

These and other aspects of the invention will be described with reference to the accompanying Drawing.

BRIEF DESCRIPTION OF THE DRAWING

In the drawing.

The same or similar elements shown in the various Figures of the Drawing are identified by the same or similar reference designations.

DETAILED DESCRIPTION OF THE DRAWING

Figure 1:
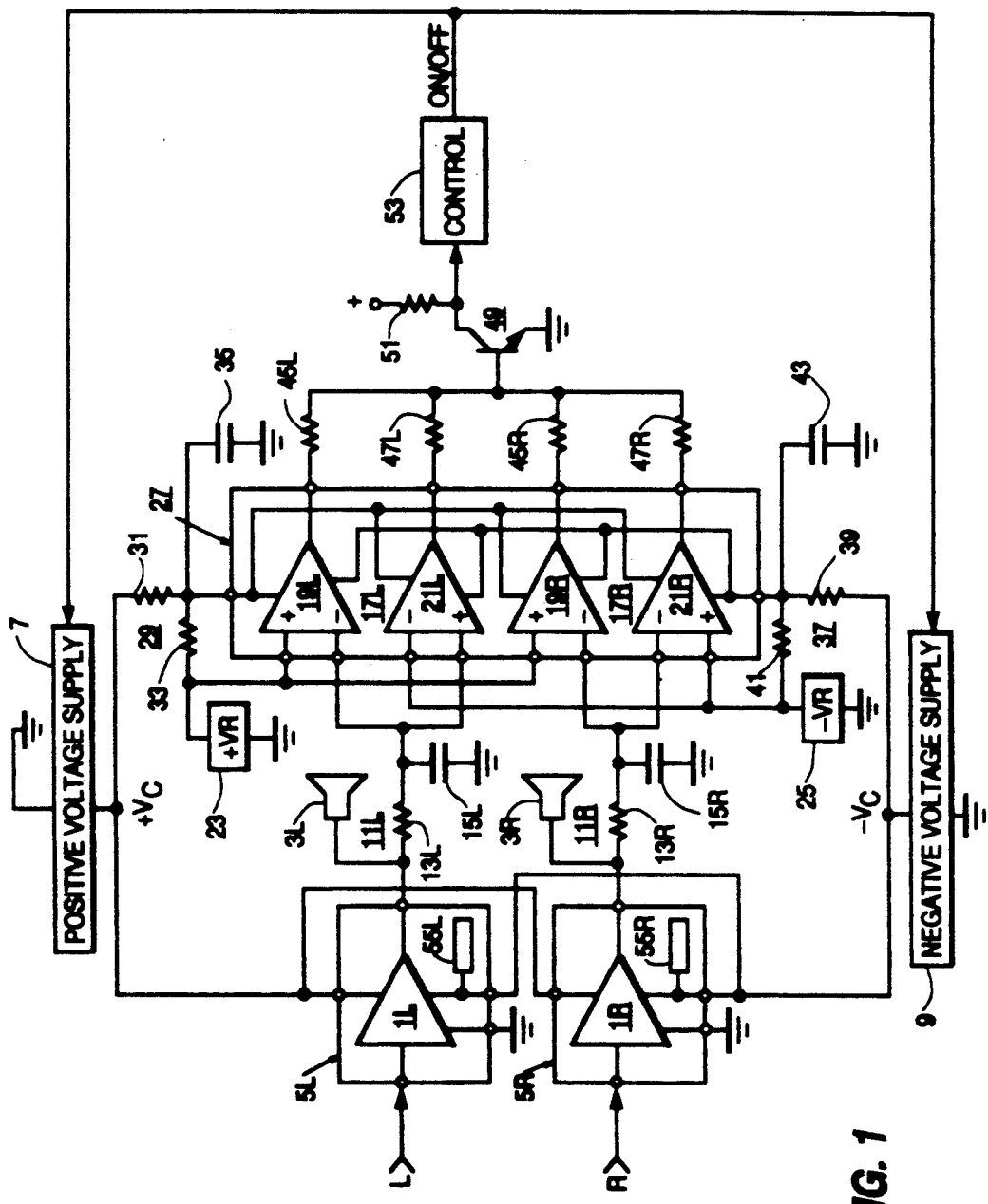
FIG. 1 is a schematic diagram of an audio output channel including a protection arrangement constructed in accordance with the invention.

The left (L) and right (R) stereophonic audio output channels, for example, of a television receiver, are shown in FIG. 1. Since the two channels are identical, except for the signals they process, only the left channel will be described in detail. A significant portion of the circuitry of each of the channels is incorporated within three integrated circuits (ICs). The ICs are indicated by rectangles and their input and output terminals are indicated by circles.

An audio power amplifier 1L amplifies a low level left audio signal (L) received at an input to produce a high level audio output signal suitable for driving a loudspeaker 3L coupled to an output. Amplifier 1L is incorporated within an IC 5L which receives a positive supply voltage ($+V_C$) from a positive voltage supply 7 and a negative supply voltage ($-V_C$) from a negative voltage supply 9 at respective voltage supply terminals. IC 5L is also connected to ground through a respective terminal. Various external elements, including a feedback path, are not shown since they are not relevant to the description of the invention. The $\mu$PC1188H audio power amplifier IC available from NEC Corporation is suitable for use as IC 5L.

As earlier noted, loudspeaker 3L may be damaged if a sustained DC signal is applied to it. To prevent such a condition, a DC detector comprising a low pass filter 11L, including a resistor a 13L and a capacitor 15L, and a so-called "window comparator" 17L, including two voltage comparators 19L and 21L and associated voltage reference sources 23 and 25, are coupled to the output of amplifier 1L.

The input of low pass filter 11L is coupled to the output of amplifier 1L. The output of low pass filter 11L, at the junction of resistor 13L and capacitor 15L, is coupled to the inverting (−) input of voltage comparator 19L and and to the non-inverting (+) input of voltage comparator 21L. The values of resistor 13L and capacitor 15L of low pass filter 11L are selected to prevent any AC components of the audio signal from being coupled to the inputs of voltage comparators 17L and 19L and to allow only a sustained DC voltage to be developed at the output of low pass filter 11L.

The non-inverting (+) input of voltage comparator 19L is coupled to positive reference voltage source 23 which supplies a reference voltage $+V_R$ and the inverting (−) input of voltage comparator 21L is coupled to negative reference voltage source 25 which supplies a reference voltage $-V_R$. Window comparator 17L, comprising voltage comparators 19L and 21L, determines whether or not the DC voltage developed at the output of low pas filter 11L is within a relatively small range between positive reference voltage $+V_R$ and negative voltage reference $-V_R$, or is outside of the range. Voltage comparators 19L and 21L (as well as voltage comparators 19R and 21R of the "right" audio output channel) are incorporated within an IC 27. A positive supply voltage for IC 27 is derived from the positive supply voltage $+V_C$ by a voltage divider 29 including a resistors 31 and 33, filter capacitor 35 and positive reference voltage supply 23. A negative supply voltage for IC 27 is derived from negative supply voltage $-V_C$ by a voltage divider 37 including a resistors 39 and 41, filter capacitor 43 and negative reference voltage supply 25. The output signals of voltage comparators 19L and 21L will have either a high level near the positive supply voltage developed by voltage divider 29 on a low level dependent on the negative supply voltage developed by the voltage divider 37 depending on which one of the respective two input signals has the greater magnitude. The LM 324A operational amplifier IC available from National Semiconductor Corporation is suitable for use as IC 27.

The outputs of voltage comparators 19L and 21L are coupled through respective resistors 45L and 47L to the base of a NPN transistor 49 configured as a common emitter amplifier. The collector of transistor 49 is coupled through a "pull-up" resistor 51 to a source of positive supply voltage and also to a control unit 53. Control unit 53, which may comprise a microprocessor, controls various functions of television receiver, including its "on/off" state in response to user initiated command signals generated by a keyboard (not shown). In connection with the "on/off" function of the television receiver, control unit 53 generates an "on/off" control signal which is coupled to positive voltage supply 7 and negative voltage supply 9. Control unit 53 also controls voltage supplies 7 and 9 in response to a fault indicating signal generated by the DC detector comprising low pass filter 11L, window comparator 17L and transistor 49.

The average value of an audio signal over any significant time period is zero. Therefore, under normal operating conditions, the magnitude of the DC voltage developed at the output of low pass filter 11L at the junction of resistor 13L and capacitor 15L is substantially zero. Under these conditions, neither one of reference voltages $+V_r$ or $-V_R$ associated with respective ones of voltages comparators 19L and 21L is exceeded and a slightly negative low level is produced at the outputs of each one of comparators 19L and 21L. The level is sufficiently low to ensure that transistor 49, which is normally non-conductive ("cut-off"), remains non-conductive. As a result, control unit 53 continues to keep the television receiver in the "on" state.

If a fault occurs within amplifier 1L, such as when one of the output transistors of amplifier 1L (which, for example, may be arranged in a so-called "push-pull" configuration) fails causing the respective supply voltage to be coupled to the output of amplifier 1L, a sustained DC voltage is developed at the output of low pass filter 11L and is coupled to window comparator 17L. Voltage comparator 19L will generate a high level at its output of the DC voltage is positive and voltage comparator 21L will generate a high level at its output if the DC voltage is negative. The high level is coupled to the base of transistor 49 and causes transistor 49 to be rendered conductive ("turned-on"). Control unit 53 responds to the low level produced at the collector of conductive transistor 49 by generating an "off" control signal. The "off" control signal causes voltage supplies 7 and 9 to be turned off, thereby removing the DC voltage from loudspeaker 3L.

In addition to the detection of the application of a sustained DC voltage to loudspeaker 3L, it is desirable to detect the loss of negative supply voltage $-V_C$ while positive supply voltage $+V_C$ is present. The reason for this will now be explained.

The semiconductor devices, resistors and other elements which comprise amplifier 1L are formed on and supported by a substrate 55L. Negative supply voltage $-V_C$ is coupled to substrate 55L so that semiconductor junctions between various elements and the substrate are reverse biased, thereby ensuring that the elements are electrically isolated. The desired electrical isolation is lost if negative supply voltage $-V_C$ is lost. This may cause a positive DC voltage to be developed at the output of amplifier 1L, which may damage loudspeaker 3L. The loss of negative supply voltage $-V_C$ may also damage IC 5L. In view of such possibility, the manufacturer of the µPC1188H audio power amplifier IC, suitable for use as IC 5L, recommends that both the positive and negative supply voltages be applied at the same time, or that the negative supply voltage be applied before the positive supply voltage. However, such, precautions cannot prevent possible damage should negative voltage supply 9 fail.

While window comparator 17L may detect the presence of a positive DC voltage at the output of amplifier due to the loss of negative supply voltage $-V_C$, the magnitude of the DC voltage is unpredictable and may be below reference voltage $+V_C$ and may therefore go undetected in this manner. Advantageously, window comparator 17L operates in another manner to detect the absence of negative supply voltage $-V_C$, as follows.

A voltage comparator such as the LM324A may be, and usually is, operated between a positive supply voltage and ground potential. In that case, the lowest level to which the output of the voltage comparator will be driven is slightly above ground potential. If negative supply voltage $-V_C$ is removed from IC 27, ground potential will be coupled to the "negative" supply voltage inputs of voltage comparators 19L and 21L instead of negative supply voltage $-V_C$ by virtue of paths to ground provided by reference voltage source 25 shown in FIG. 2b and various other loads of negative supply voltage supply 9 which are not shown. Accordingly, if negative supply voltage $-V_C$ is lost, the lowest level to which the outputs of voltage comparators 19L and 21L will be able to be driven is slightly above ground potential. That level is above the conduction threshold of transistor 49 and therefore insufficient to keep transistor 49 non-conductive (cutoff). As a result, transistor 49 is rendered conductive (turned on) and a low level fault signal is developed at its collector. Control unit 53 generates an "off" control signal in response to the low level fault signal causing positive voltage supply 7, as well as the rest of the television receiver, is to be turned off.

Thus, by utilizing both positive and negative supply voltages, window comparator 17L is capable of detecting the loss of negative supply voltage $-V_C$ as well as detecting the development of a sustained DC signal at the output of power amplifier 1L. It is noted that although a fault will be indicated when negative supply voltage $-V_C$ is lost, no fault will be indicated if both negative supply voltage $-V_C$ and positive voltage $+V_C$ are absent. As a result, it is possible to turn the receiver on for troubleshooting tests.

The utilization of both positive and negative supply voltages rather than only a single polarity supply voltage is also advantageous since it permits positive and negative reference voltages relatively close to ground potential to be utilized. This in turn permits a DC fault to be detected more quickly. In a protection arrangement, such as is disclosed in the Morris and Johnson patent application referred to above, in which only a single polarity supply voltage is utilized, a reference voltage which is approximately one-half of the magnitude of the supply voltage is utilized to permit both positive and negative DC voltages to be detected. As a result, the voltage across the capacitor of the low pass filter of the DC detector must charge to approximately one-half of the magnitude of the supply voltage before a DC fault can be detected. The present protection arrangement utilizing both positive and negative supply voltages avoids such an undesirable delay because positive and negative reference voltages $+V_R$ and $-V_R$ can have much lower magnitudes than the magnitude of the single reference voltage of a protection arrangement utilizing a single polarity supply voltage.

Figure 2A:
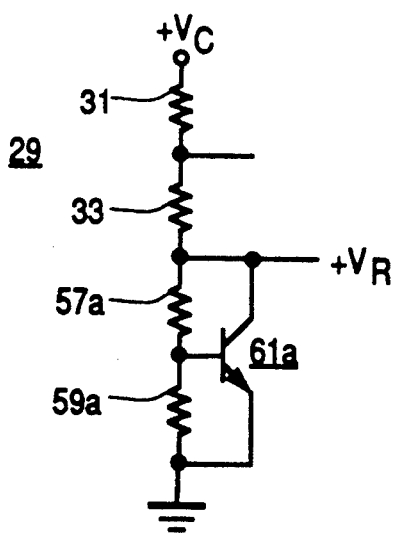
FIGS. 2a and 2b are schematic diagrams of respective voltage reference sources utilized in the protection arrangement shown in FIG. 1.
Figure 2B:
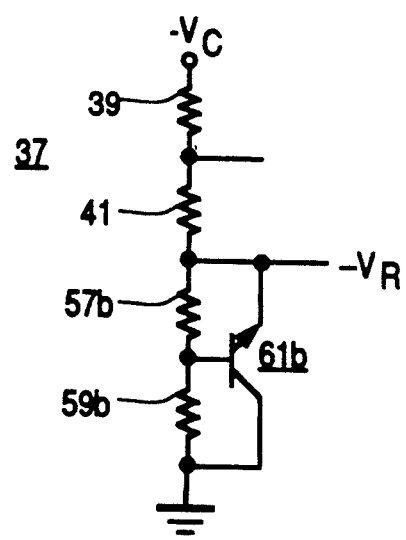

Implementations of voltages reference sources 23 and 25 are shown in FIGS. 2a and 2b, respectively. Voltage reference 23 includes resistors 57a and 59b connected in series between resistor 33 and ground and a NPN transistor 61a having its base connected to the junction of resistors 57a and 59a, its collector connected to the junction of resistors 33 and 57a and its emitter connected to ground. The magnitude of reference voltage $+V_R$ is determined by the ratio of resistors 57a and 59a. The implementation of reference voltage source 23 shown in FIG. 2a has a relatively lower output impedance compared with a conventional voltage divider and is therefore capable of supplying a reference voltage to more comparison circuits. This is particularly desirable when there are several audio output channels, for example, left and right audio output channels for both internal and external loudspeakers. The implementation of reference voltage source 23 shown in FIG. 2a is also capable of supplying a reference voltage with a lower magnitude, for example 2 volts, compared with a Zener diode. The implementation of voltage reference 25 shown in FIG. 2b is very similar to the implementation of voltage reference 23 shown in FIG. 2a and therefore corresponding elements are identified with the the same reference numbers, except that the letter "a" has been replaced with the letter "b". The major difference between the implementation of reference voltage source 25 and reference voltage source 23 is that the connections of the emitter and collector NPN transistor 61b are reversed with respect to the connections of the emitter and collector of transistor 61a because of the different polarities which are involved.

The present invention has been described by way of example with reference to a particular embodiment. Modifications to the described embodiment and other embodiments may become apparent by those skilled in the art. These modifications and other embodiments are intended to be within the scope of the invention defined by one or more of the following claims.

We claim:

1. Apparatus comprising:
  a source of a first supply voltage;
  a source of a second supply voltage having a polarity opposite to that of said first supply voltage;
  a source of an audio signal;
  an audio power amplifier normally receiving said first and second supply voltages at respective ones of first and second power supply input terminals of said amplifier, receiving said audio input signal at an input terminal and providing an audio output signal at an output terminal;
  means for coupling a loudspeaker to said output terminal of said audio amplifier; and
  a detector coupled to said output of said amplifier, coupled to said first source of said first supply voltage and said second source of said second supply voltage and which is directly responsive to one of said first and second supply voltages which is normally received at a respective one of said first and second power supply input terminals of said amplifier for generating a signal indicative of a fault condition when either or both of (1) a DC signal is produced at said output terminal of said amplifier or (2) said one of said supply voltages which is normally received at said respective one of said first and second power supply input terminal of said amplifier is absent, said detector however not generating said signal indicative of said fault condition when both of said first and second supply voltages are absent.

2. The apparatus recited in claim 1, wherein:
  said detector normally receives said first and second supply voltages at respective ones of first and second power supply input terminals of said detector and is directly responsive to the absence of said one of said supply voltages at the respective power supply terminal of said detector for generating said fault indicative signal.

3. The apparatus recited in claim 2, wherein:
  said amplifier is incorporated within an integrated circuit including a substrate on which semiconductor devices are supported, said second supply voltage is negative and is coupled to said substrate, the absence of said second supply voltage tending to cause a DC signal to be produced at said output of said amplifier; and
  said one of said supply voltages is said second supply voltage.

4. Apparatus comprising:
  a source of a first supply voltage;
  a source of a second supply voltage having a polarity opposite to that of said first supply voltage;
  a source of an audio signal;
  an audio power amplifier normally receiving said first and second supply voltages at respective power supply input terminals, receiving said audio input signal at an input terminal and providing an audio output signal at an output terminal;
  means for coupling a loudspeaker to said output terminal of said audio amplifier; and
  a detector normally receiving said first and second supply voltages which are received at respective ones of said power supply input terminals of said audio power amplifier at respective power supply input terminals of said detector, being coupled to said output of said amplifier and being directly responsive to one of said first and second supply voltages which is normally received at a predetermined one of said power supply input terminals of said amplifier for generating a signal indicative of a fault condition when either or both of (1) a DC signal is produced at said output terminal of said amplifier or (2) said one of said first and second supply voltages which is normally received at said predetermined one of said power supply input terminals of said amplifier is absent, said detector however not generating said signal indicative of said fault condition when both of said first and second supply voltages are absent.

5. The apparatus recited in claim 4, wherein:
  said detector includes a low pass filter having an input coupled to the output of said amplifier and an output; a first comparator having an input which is coupled to to the output of said low pass filter and which generates a first output signal at an output when the output signal of said low pass filter exceeds a first voltage threshold; a second comparator having an input which is coupled to to the output of said low pass filter and which generates a second output signal at an output when the output signal of said low pass filter exceeds a second voltage threshold having a polarity opposite to that of said first voltage threshold; means responsive to either of said first and second output signals for producing said fault signal; at least one of said first and second output signal also being generated in response to the absence of said one of said first and second supply voltages which is normally received at said predetermined one of said power supply input terminals of said amplifier.

6. The apparatus recited in claim 4, wherein:

said means for producing said fault signal is a threshold device having an output at which said fault signal is generated when a signal coupled to an input exceeds a given threshold, each of a said first and second signals having a level which exceeds said given threshold; and at least one of said comparators is unable to generate an output signal which does not exceed said given threshold when said one of said first and second supply voltages which is normally received at said predetermined one of said power supply input terminals of said amplifier is absent.

7. The apparatus recited in claim 4, wherein:

said amplifier is incorporated within an integrated circuit including a substrate on which semiconductor devices are supported, said second supply voltage is coupled to said substrate, the absence of said second supply voltage tending to cause a DC signal to be produced at said output of said amplifier; and said one of said first and second supply voltages is said second supply voltage.

8. The apparatus in claim 7, wherein:

said second supply voltage is negative.

9. Apparatus comprising:

a source of a positive supply voltage;

a source of a negative supply voltage having a polarity opposite to that of said first supply voltage;

a source of an audio signal;

an audio power amplifier normally receiving said positive and negative supply voltages at respective power supply input terminals, receiving said audio input signal at an input and providing an audio output signal at an output terminal; said amplifier being incorporated within an integrated circuit including a substrate on which semiconductor devices are supported, said negative supply voltage being coupled to said substrate, the absence of said negative supply voltage tending to cause a DC signal to be produced at said output of said amplifier;

means for coupling a loudspeaker to said output terminal of said audio amplifier; and a detector normally receiving said positive and negative supply voltages which are normally received at respective ones of said power supply input terminals of said audio power amplifier at respective power supply input terminals of said detector, being coupled to said output of said amplifier and being directly responsive to said negative supply voltage which is normally received at said respective one of said power supply input terminals of said amplifier for generating a signal indicative of a fault condition when either or both of (1) a DC signal is produced at said output of said amplifier or (2) said negative supply voltage which is normally received at said respective one of said power supply input terminals of said amplifier is absent, said detector however not generating said signal indicative of said fault condition when both of said positive and negative supply voltages are absent.

10. Apparatus comprising:

a source of a first supply voltage;

a source of a second supply voltage having a polarity opposite to that of said first supply voltage;

a source of an audio signal;

an audio power amplifier normally receiving said first and second supply voltages at respective power supply input terminals, receiving said audio input signal at an input and providing an audio output signal at an output terminal;

means for coupling a loudspeaker to said output terminal of said audio amplifier;

a detector coupled to said output of said amplifier for generating a signal indicative of a fault condition when either or both of (1) a DC signal is produced at said output of said amplifier or (2) a predetermined one of said first and second supply voltages is absent, said detector however not generating said signal indicative of said fault condition when both of said first and second supply voltages are absent;

said detector including a low pass filter having an input coupled to the output of said amplifier and an output; a first comparator normally receiving said first and second supply voltages at respective supply voltage terminals and having an input coupled to the output of said low pass filter and which generates a first output signal above a given level at an output when the output signal of said low pass filter exceeds a first threshold; a second comparator normally receiving said first and second supply voltages at respective supply voltage terminals and having an input coupled to the output of said low pass filter and which generates a second output signal having a level which exceeds said given level at an output when the output signal of said low pass filter exceeds a second threshold having a polarity opposite to that of said first voltage threshold; and a threshold device having an output at which said fault signal is generated when a signal coupled to an input has a level which exceeds said given level; at least one of said comparators being directly responsive to said predetermined one of said first and second supply voltages which is normally received at a respective one of said first and second power supply input terminals of said amplifier and being unable to generate an output signal which does not exceed said given level when said predetermined one of said first and second supply voltages is absent.

* * * * *